United States Patent
Laucournet (10) Patent No.: US 9,005,488 B2
(45) Date of Patent: Apr. 14, 2015

(54) AQUEOUS INK FOR PRODUCING HIGH-TEMPERATURE ELECTROCHEMICAL CELL ELECTRODES

(71) Applicant: Commissariat a l'Energie Atomique et aux Energies Alternatives, Paris (FR)

(72) Inventor: Richard Laucournet, La Buisse (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 4 days.

(21) Appl. No.: 13/790,900

(22) Filed: Mar. 8, 2013

(65) Prior Publication Data

US 2013/0192997 A1 Aug. 1, 2013

Related U.S. Application Data

(63) Continuation of application No. PCT/FR2011/051828, filed on Jul. 28, 2011.

(30) Foreign Application Priority Data

Sep. 13, 2010 (FR) ...................................... 10 57247

(51) Int. Cl.

| | |
|---|---|
| *H01B 1/12* | (2006.01) |
| *H01B 1/02* | (2006.01) |
| *C09D 11/00* | (2014.01) |
| *C04B 35/48* | (2006.01) |
| *C09D 11/52* | (2014.01) |
| *H05K 1/09* | (2006.01) |
| *C09D 11/0235* | (2014.01) |
| *C09D 11/037* | (2014.01) |
| *H01M 4/86* | (2006.01) |
| *H01M 4/88* | (2006.01) |
| *H01M 8/12* | (2006.01) |

(52) U.S. Cl.
CPC ............... *C09D 11/52* (2013.01); *H05K 1/095* (2013.01); *C09D 11/0235* (2013.01); *C09D 11/037* (2013.01); *H01M 4/8621* (2013.01); *H01M 4/8828* (2013.01); *H01M 4/8835* (2013.01); *H01M 8/1206* (2013.01); *Y02E 60/522* (2013.01)

(58) Field of Classification Search
None
See application file for complete search history.

(56) References Cited

U.S. PATENT DOCUMENTS

| | | | | |
|---|---|---|---|---|
| 3,168,864 | A * | 2/1965 | Brandl, Jr. et al. | 430/302 |
| 5,190,834 | A * | 3/1993 | Kendall | 429/466 |
| 5,964,991 | A * | 10/1999 | Kawasaki et al. | 204/282 |
| 7,736,787 | B2 * | 6/2010 | Day et al. | 429/460 |
| 8,192,888 | B2 * | 6/2012 | Day et al. | 429/465 |
| 2003/0224240 | A1 | 12/2003 | Yamashita et al. | |
| 2007/0180689 | A1 * | 8/2007 | Day et al. | 29/623.5 |

(Continued)

FOREIGN PATENT DOCUMENTS

| | | |
|---|---|---|
| WO | 2004/040627 A2 | 5/2004 |
| WO | 2004/063295 A1 | 7/2004 |
| WO | 2006/066973 A2 | 6/2006 |

OTHER PUBLICATIONS

Spiro, M., "Polyelectrodes: The Behaviour and Applications of Mixed Redox Systems," Chem. Soc. Rev., 15, pp. 141-164 (1986).*

(Continued)

*Primary Examiner* — Harold Pyon
*Assistant Examiner* — Jason Thomas
(74) *Attorney, Agent, or Firm* — Burr & Brown, PLLC (57) ABSTRACT

The invention aims at an aqueous ink for high-temperature electrochemical cell electrodes and/or electrolyte containing particles of at least one mineral filler, at least one binder, and at least one dispersant. It also concerns the electrode and the electrolyte using such an ink.

15 Claims, 6 Drawing Sheets

(56) References Cited

U.S. PATENT DOCUMENTS

2010/0193104 A1\* 8/2010 Ryu et al. .................. 156/62.2
2011/0152195 A1\* 6/2011 O'Mahony et al. .......... 514/16.7

OTHER PUBLICATIONS

R. I. Tomov, et al., "*Direct Ceramic Inkjet Printing of Yttria-Stabilized Zirconia Electrolyte Layers for Anode-Supported Solid Oxide Fuel Cells*," Journal of Power Sources, vol. 95, No. 21, Nov. 1, 2010, pp. 7160-7167.

J.P.P. Huijsmans, et al., "*Production Line for Planar SOFC Ceramics: From Laboratory to Pre-Pilot Scale Manufacturing*," Fuel Cells Bulletin, vol. 2, Issue 14, Nov. 1999, pp. 5-7 (Abstract Only).

International Search Report dated Dec. 27, 2011.

\* cited by examiner (PRIOR ART)

AQUEOUS INK FOR PRODUCING HIGH-TEMPERATURE ELECTROCHEMICAL CELL ELECTRODES

BACKGROUND OF THE INVENTION

1. Field of the Invention

The invention relates to an aqueous ink for the forming of electrodes for an electrochemical cell operating at high temperature. Such an aqueous ink comprises a mineral filler, a binder, and a dispersant.

The field of application especially relates to the manufacturing, by screen printing, of ceramic components for electrochemical cells intended for high-temperature fuel cell applications (SOFC, "solid fuel cells") and for high-temperature electrolysis of water vapor (EHT or SOEC, "solid oxide electrolyzer cell").

2. Description of Related Art

Ceramic electrochemical cells dedicated to high-temperature applications (600-1,000° C.) may have a so-called electrolyte supported cell configuration. In this embodiment, the thick electrolyte (120-200 micrometers) also fulfils the function of mechanical support for the entire cell; the electrodes (anode and cathode) being generally arranged on either side of the electrolyte according to the following concept:

- yttria-stabilized zirconia (YSZ) electrolyte;
- so-called hydrogen electrode (anode in SOFC use or cathode in EHT) comprising a mixture of yttria-stabilized zirconia (YSZ) or of ceria substituted with yttria (CYO) or gadolinium oxide (CGO), and nickel oxide (NiO). The nickel oxide is reduced at the starting of the cell to form metal nickel and thus form a cermet (sintered composite material formed of at least a metal and a ceramic product);
- air electrode (cathode in SOFC use or anode in EHT) typically comprising a mixture of yttria-stabilized zirconia (YSZ) and of lanthanum strontium manganite (LSM).

Generally, the electrodes comprise (a) a so-called functional layer where the electrochemical reaction takes place and (b) a so-called collector layer in charge of collecting (in SOFC mode) or supplying (in EHT mode) the current.

This electrochemical cell manufacturing method has especially been described by Huijsmans et al. (Fuel Cells Bulletin, Volume 2, Issue 14. November 1999, Pages 5-7). The electrolyte is first formed by strip casting before being sintered (densified) at 1,500° C. Its thickness may vary from 80 to 250 micrometers. Then, the two electrodes of lower thickness (≈50 μm) are deposited on either side of the electrolyte by screen printing, and simultaneously sintered at a temperature ranging between 1,200 and 1,300° C.

Other thin film (a few tens of microns) forming methods have been described. These especially are suspension spraying, spin coating, or suspension coating. These methods require an ink or a ceramic suspension containing the electrode materials in the form of powder. According to these embodiments, the formulations of the suspensions or ceramic inks are generally comprised of:

- the mineral filler: LSM, LSM/YSZ mixture, NiO, NiO/YSZ mixture (or CYO, CGO), YSZ (or CYO, CGO);
- an organic solvent: terpineol, alcohol, methyl ethyl ketone;
- an organic binder in charge of the bonding between the ceramic particles forming the electrodes and the electrolyte before sintering: ethyl cellulose, polyvinyl butyral.

Figure 1:
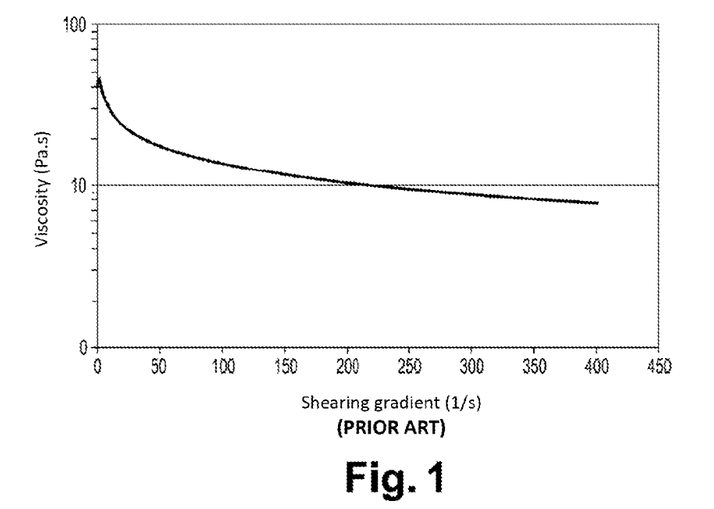
FIG. 1 shows the typical rheogram of a screen printing ceramic ink (LSM).

The screen printing quality of the electrode depends on the rheological behavior of the ink. The ink must especially have a shear rate thinning or pseudoplastic behavior, that is, an infinite viscosity in the absence of shearing to avoid its flowing after printing and a low viscosity in the presence of shearing to ease the passing of ink through the printing screen (FIG. 1).

Typically, for a fine-quality printing, the ink viscosity must range between 3 and 20 Pa·s for the shearing imposed by the screen printer (from 40 to 700 $s^{-1}$). Thus, the electrode has advantages, among which the absence of surface defects (homogeneous thickness), an easy screen-substrate separation (no bubbles), and the fact that the ink does not spread after the printing can be noted.

However, independently from the organic formulation, the drying phase causes the total volatilization of the solvents and thus the emission of irritant vapors. At an industrial production scale, tons of vapor may be emitted, which require the provision of an installation of vapor collection and condensation for a possible subsequent reuse.

Electrode manufacturing methods implying the use of organic inks, as described in document WO2006/066973, thus have non-negligible disadvantages especially due to the use of organic solvents.

The use of aqueous inks comprising the same quantity of mineral filler as prior art organic inks has up to now mainly run up against the incompatibility between the viscosity of said aqueous ink and screen printing deposition.

The Applicant has however developed an aqueous ink having a rheological behavior comparable to that of an organic ink without for all this significantly modifying the filler rate. Further, the mineral filler dispersion is improved in aqueous phase with respect to organic solvents. The aqueous ink according to the present invention further avoids having to use installations for capturing and condensing organic solvent vapors, without altering the cell component performances.

SUMMARY OF THE INVENTION

The present invention relates to an aqueous ink having a viscosity and a mineral filler quantity comparable to those of prior art organic inks. Thus, the thickness of the deposited layer, which is directly proportional to the filler rate, is maintained. Further, the nature of this aqueous ink also enables to simplify its preparation, its use, as well as its drying during the manufacturing of electrodes.

More specifically, the present invention relates to an aqueous ink for high-temperature electrochemical cell electrodes and/or electrolyte, said ink comprising:

- particles of at least one mineral filler,
- at least one binder, and
- at least one dispersant selected from the group comprising hydrochloric acid, sulfuric acid, or polyelectrolytes such as ammonium citrate and ammonium carboxylates.

The mineral filler, or active electrode material, especially enables to conduct electricity and provides for the electrochemical reactions. The mineral filler generally is a metal oxide and it may more specifically be selected from the group comprising oxides of transition metals and of rare earths, and mixtures thereof. More advantageously still, the mineral filler is selected from the group comprising LSM (lanthanum strontium manganite), YSZ (yttria-stabilized zirconia), NiO (nickel oxide), CYO (yttrium-substituted cerium oxide), CGO (gadolinium-substituted cerium oxide), the LSM/YSM mixture, the YSZ/NiO mixture, and mixtures thereof.

Advantageously, the mineral filler amounts to from 10 to 30% by volume with respect to the aqueous ink volume, more advantageously from 15 to 25% by volume.

Typically, the diameter of the mineral filler particles is such that $d_{50}<10$ micrometers and $d_{90}<50$ micrometers. Term "$d_{50}<10$ micrometers" means that 50% of the mineral filler particles have a diameter smaller than 10 micrometers while "$d_{90}<50$ micrometers" means that 90% of said particles have a diameter smaller than 50 micrometers.

More advantageously still, $d_{50}<1$ micrometer and $d_{90}<2$ micrometer.

Advantageously, the specific surface area of the mineral filler particles is smaller than 20 m²/g.

The binder of the aqueous ink according to the present invention ensures the cohesion of the deposition and the bonding between particles and the electrolyte before sintering in the case of the manufacturing of an electrode. Generally, it differs from that of prior art organic inks by the nature of the solvent (water).

The binder may advantageously be selected from the group comprising PVA (polyvinyl alcohol), PEG (polyethylene glycol), polyacrylates, cellulose, and generally all polymers soluble in water, and mixtures thereof.

According to a preferred embodiment, the binder is a PVA/PEG mixture. It will be within the abilities of those skilled in the art to adjust the PVA/PEG ratio according to the other components of the aqueous ink and to the desired ink viscosity. Advantageously, the PVA/PEG mixture is such that PVA represents from 80 to 100% by weight of the weight of the PVA/PEG mixture, and more advantageously from 95 to 99% by weight.

The quantity of binder and/or the nature of the binder are adjusted to obtain an aqueous ink having a rheological behavior comparable to that of an organic ink, without for all this modifying the mineral filler rate. Generally, the volume formed by the binder quantity must not be greater than the porous volume desired at the end of the electrode sintering heat treatment. Advantageously, the binder represents from 20 to 50% by volume with respect to the volume of the aqueous ink, and more advantageously still between 25 and 35% by volume.

The aqueous ink according to the present invention also comprises at least one dispersant. It enables to electrically load the surface with oxide particles and to thus to provide a good quality of dispersion by electrostatic repulsion with a very good time stability. The dispersant may advantageously be selected from the group comprising hydrochloric acid, sulfuric acid, or poly-electrodes such as ammonium citrate and ammonium carboxylates. More advantageously still, the dispersant is ammonium citrate.

Advantageously, the dispersant percentage ranges between 0.05 and 1% by weight with respect to the weight of the mineral load, and more advantageously between 0.3 and 0.7% by weight.

In a specific embodiment of the invention, the aqueous ink comprises a mixture of polyvinyl alcohol (PVA) and of polyethylene glycol (PEG) as a binder, and ammonium citrate as a dispersant.

Advantageously, the viscosity of the aqueous ink according to the invention ranges between 1 and 60 Pa·s at the printing shearing. It will be within the abilities of those skilled in the art to adjust the ink composition to obtain the desired viscosity by modulating the filler rate and/or the quantity of binder(s).

Typically, the preparation of the aqueous ink according to the invention comprises the steps of:
  dissolving at least one dispersant by a low concentration, preferably from 0.05 to 1% by weight with respect to the weight of the mineral filler;
  adding at least one mineral filler and dispersing by mechanical grinding, preferably by means of a ball grinder, or of a triple roll mill, or of a planetary disperser;
  adding at least one binder in solution and mixing.

Generally, the aqueous ink according to the present invention can also be used to elaborate components (electrodes and electrolytes) of anode-supported cells or of metal supported cells.

The present invention also relates to (a) the use of the aqueous ink such as described hereabove for the manufacturing of an electrolyte and for the manufacturing of an electrochemical cell electrode, (b) the associated forming methods, as well as (c) the electrode and the electrolyte obtained according to the respective forming methods.

In the case of anode-supported or metal-supported cells, the electrolyte according to the present invention may be obtained by a method comprising the deposition, advantageously by screen printing, of the above-described aqueous ink. According to a specific embodiment, the electrolyte is made of YSZ.

The method for forming the electrode according to the present invention especially comprises the steps of:
  depositing a first aqueous ink according to the invention, advantageously by screen printing, to form the functional layer;
  depositing a second aqueous ink according to the invention, advantageously by screen printing on the functional layer, to form the collector layer;
  sintering the electrode.

In the case of a hydrogen electrode containing NiO, the functional layer is deposited on a bonding layer, itself advantageously prepared by previous deposition of an aqueous ink according to the invention on the electrolyte. In the case of an air electrode, the functional layer is directly deposited on the electrolyte.

The present invention also relates to an electrode capable of being obtained according to the above-described method. Said electrode may be an air or hydrogen electrode.

It will be within the abilities of those skilled in the art to adjust the composition of the aqueous ink according to the envisaged electrode and/or electrolyte type.

Advantageously, an air electrode according to the invention comprises:
  a functional layer, obtained by deposition of an aqueous ink advantageously comprising an LSM/YSZ mixture, said deposition being performed on a dense electrolyte, advantageously made of YSZ;
  a conductive layer, advantageously obtained by deposition of an aqueous ink comprising LSM.

Advantageously, a hydrogen electrode according to the invention comprises:
  a bonding layer, obtained by deposition of an aqueous ink advantageously comprising YSZ, said deposition being performed on a dense electrolyte, advantageously made of YSZ;
  a functional layer, advantageously obtained by deposition of an aqueous ink comprising a NiO/YSZ mixture;
  a conductive layer, advantageously obtained by deposition of an aqueous ink comprising NiO.

In the context of the present invention, the aqueous ink deposition is generally performed by screen printing during the electrode manufacturing.

Typically, for a cell of anode-supported cell type, the electrolyte thickness ranges between 80 and 200 micrometers while the thickness of the different collector, functional, and bonding layers varies from 5 to 50 micrometers.

The present invention also relates to an electrochemical cell comprising at least one electrode and/or one electrolyte such as described hereabove.

In a very specific embodiment, the electrochemical cell according to the invention comprises:
- an electrolyte according to the invention, advantageously made of yttria-stabilized zirconia (YSZ);
- a hydrogen electrode according to the invention, preferentially comprising a mixture of yttria-stabilized zirconia (YSZ) or of ceria substituted with yttrium oxide (CYO) or gadolinium oxide (CGO) and of nickel oxide (NiO);
- an air electrode according to the invention preferentially comprising a mixture of yttria-stabilized zirconia (YSZ) and of lanthanum strontium manganite (LSM).

BRIEF DESCRIPTION OF THE DRAWINGS

The invention and the resulting advantages will better appear from the following drawings and examples.

DETAILED DESCRIPTION OF THE INVENTION

Figure 2:
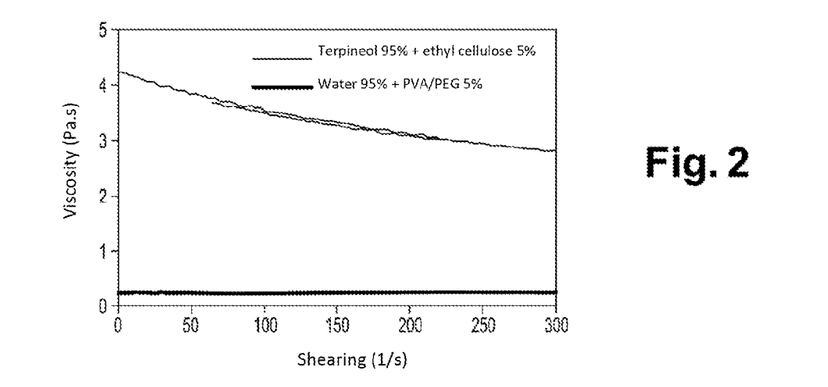
FIG. 2 shows the rheological behavior of an organic solvent (95% terpineol+5% ethyl cellulose) and of an aqueous solvent (95% water+5% PVA/PEG).

An organic solution (terpineol, for example) and an aqueous solution containing the same quantity of binder do not have the same viscosity (FIG. 2). To obtain a close viscosity, the respective proportions of solvent/binder/mineral filler are thus adjusted. Indeed, a composition comprising 77.4% by volume of organic solvent, 19.3% by volume of mineral filler, and 3.3% by volume of binder provides an organic ink (ink b) compatible with printing techniques. However, the corresponding aqueous ink (ink a) is not adapted to the printing of electrodes (table 1 and FIG. 3). Increasing the filler rate to 30% enables to obtain a rheological behavior comparable to that of organic ink. However, the ink then obtained (ink c) dries too rapidly and thus is unstable along time, which compromises its use for screen printing.

Figure 3:
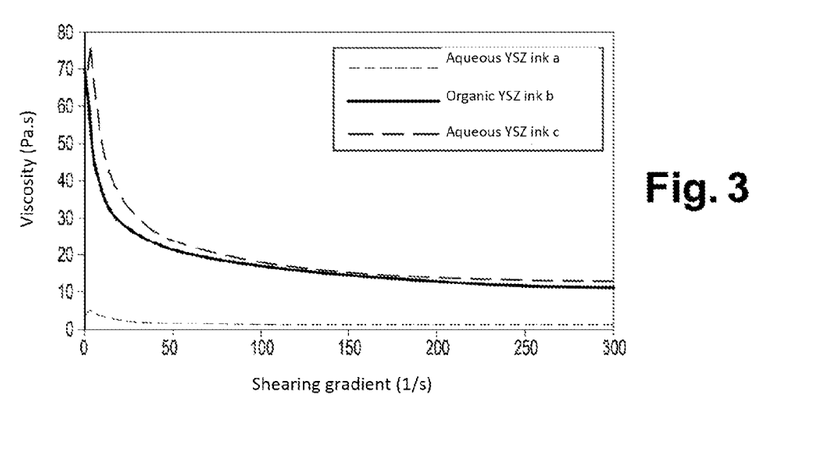
FIG. 3 shows the typical rheograms of organic and aqueous YSZ inks for screen printing.

The compositions of inks containing yttria-stabilized zirconia (YSZ), having their rheograms plotted in FIG. 3, are shown in table 1.

TABLE 1

Composition of YSZ inks (FIG. 3)

| Ink reference | Ink nature | % vol. YSZ | % vol. solvent | % vol. binder | Comments |
|---|---|---|---|---|---|
| aqueous YSZ a | Aqueous | 19.3% | 77.4% (Water) | 3.3% (Polyvinyl alcohol) | Flow after printing |
| organic YSZ b | Organic | 19.3% | 77.4% (Terpineol) | 3.3% Ethyl cellulose | No flow after printing. Slow drying |
| aqueous YSZ c | Aqueous | 26.7% | 70.0% (Water) | 3.3% (Polyvinyl alcohol) | No flow after printing. Drying too fast |

Examples 1 and 2 relate to aqueous and organic inks, their use to manufacture air and hydrogen electrodes as well as electrochemical cells comprising said electrodes. Examples 1 and 2 have been achieved with mineral filler particles having a $d_{50}$ smaller than 2 micrometers and having a specific surface area smaller than 20 m²/g.

Figure 4:
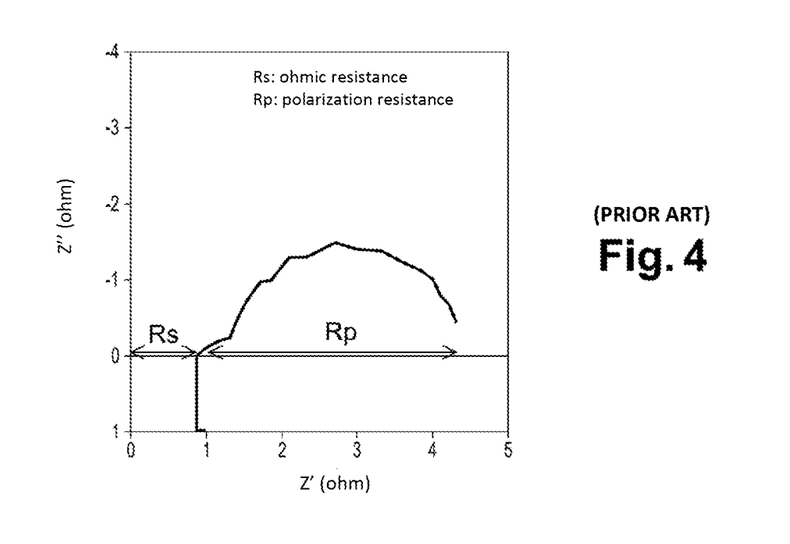
FIG. 4 shows the characteristic impedance spectrum of an electrode.

The individual electrochemical electrode performances are assessed by means of complex impedance spectroscopy based on so-called symmetrical cells, comprising the same electrodes on either side of an electrolyte. This technique enables, based on an impedance spectrum and according to temperature, to measure the characteristic resistance of electrodes in an atmosphere representative of their operation. For each of the electrodes, a purely ohmic resistance (Rs) and a polarization resistance (Rp) characteristic of the electrochemical reaction occurring within the electrode are measured (FIG. 4). As an example, the electrochemical characteristics of composite electrodes containing LSM/YSZ and NiO/YSZ are summed up in table 2.

TABLE 2

Polarization resistances of electrodes obtained by screen printing of organic inks (prior art)

| Electrode | Rp (omh · cm$^2$) | Temperature (° C.) |
|---|---|---|
| Ni/YSZ composite H$_2$ electrode | 0.50 | 1000 |
|  | 0.64 | 850 |
|  | 1.12 | 800 |
|  | 1.51 | 750 |
| LSM/YSZ composite Air electrode | 0.04 | 950 |
|  | 0.08 | 900 |
|  | 0.19 | 850 |
|  | 0.37 | 800 |

Example 1

Composite Air Electrode Containing LSM/YSZ a) Organic Inks (Prior Art):

A so-called symmetrical cell is prepared by means of two organic inks having a composition according to table 3.

TABLE 3

Composition of organic inks containing LSM (prior art)

| Ink reference | % vol. mineral filler | % vol. terpineol | % vol. ethyl cellulose | Viscosity$^{(i)}$ (Pa · s) |
|---|---|---|---|---|
| LSM/YSZ 50/50% pds | 19.3% | 77.4% | 3.3% | 8 |
| LSM | 19.3% | 77.4% | 3.3% | 6.5 |

Figure 5:
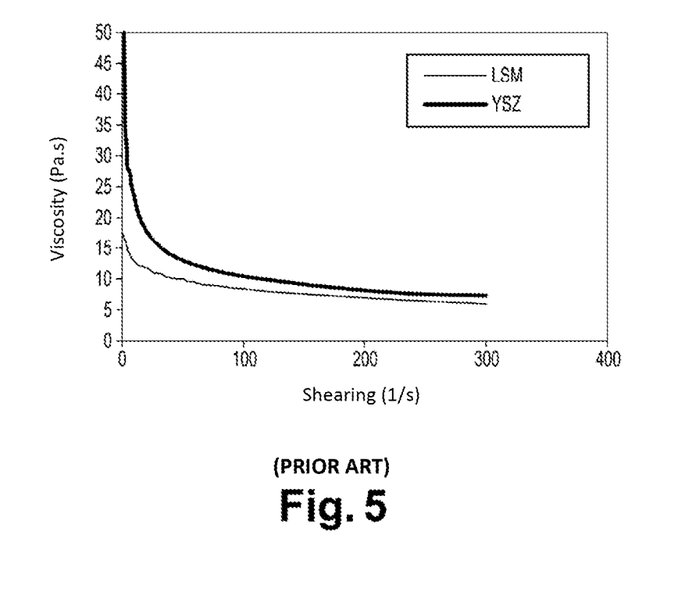
FIG. 5 shows the typical rheological behavior of organic LSM/YSZ and LSM inks for screen printing.

$^{(i)}$ Viscosity measured at the printing shearing (250 s$^{-1}$) (FIG. 5)

The shearing during the screen printing can be calculated from the screen characteristics, that is, the thread diameter (e) and the distance between threads (d) as well as from certain parameters of the machine (printing scraper advancing speed (v)) according to the following formula:

Shearing (s$^{-1}$)=2*e*v/d$^2$

The ink containing LSM/YSZ is deposited symmetrically (2 faces) on a dense YSZ electrolyte with a 30-micrometer thickness per screen printing to obtain the functional layer of the electrode.

The ink containing LSM is similarly deposited on the functional layers with a 15-micrometer thickness per screen printing to obtain the electrode collector layer.

Figure 6:
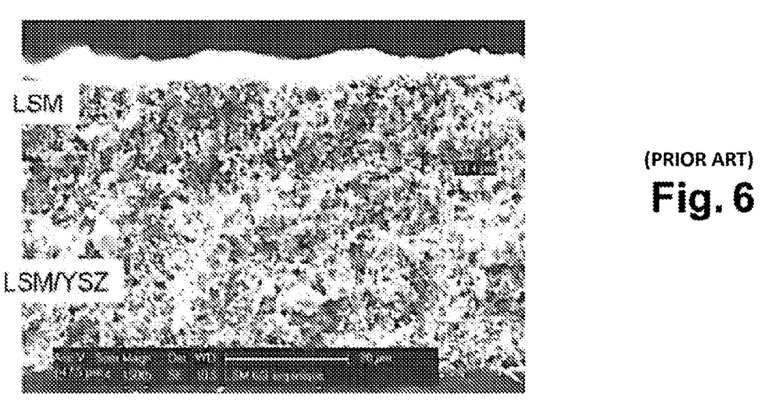
FIG. 6 illustrates the typical microstructure of an air electrode based on LSM formed from organic inks and calcined at 1,050° C. for 3 hours under air.

This so-called "symmetrical" cell is calcined at 1.050° C. for 3 hours under air and characterized by complex impedance spectroscopy at different temperatures. The typical electrode microstructure is shown in FIG. 6.

b) Aqueous Inks (Invention):

Similarly to the symmetrical cell obtained by means of organic inks, a cell having approximately 30 micrometers of functional layer (LSM/YSZ) and 15 micrometers of collector layer (LSM) is obtained by means of aqueous inks having a composition according to table 4.

TABLE 4

Composition of aqueous inks containing LSM (invention)

| Ink reference | % vol. mineral filler | % vol. water | % vol. PVA | % vol. PEG | % weight ammonium citrate/ mineral filler | Viscosity$^{(i)}$ (Pa · s) |
|---|---|---|---|---|---|---|
| LSM/YSZ 50/50% weight | 19.8% | 46.2% | 29.7% | 4% | 0.3% | 2.5 |
| LSM | 20.2% | 45.8% | 29.7% | 4% | 0.3% | 3.5 |

Figure 7:
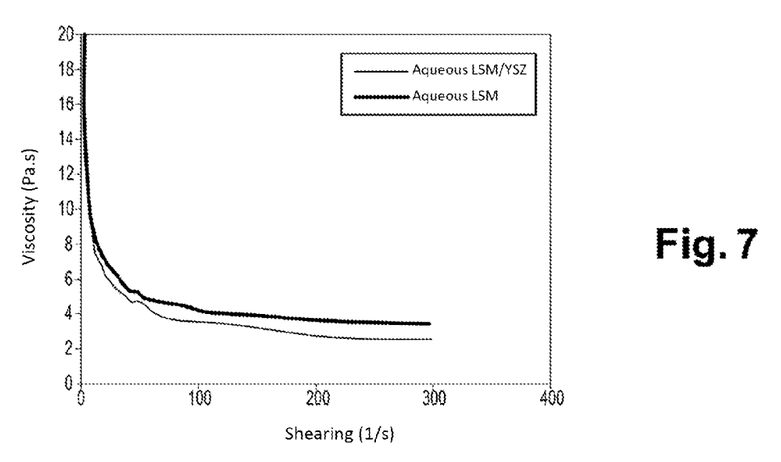
FIG. 7 shows the typical rheological behavior of aqueous LSM/YSZ and LSM inks.

$^{(i)}$Viscosity measured at the printing shearing (250 s$^{-1}$) (FIG. 7)

Figure 8:
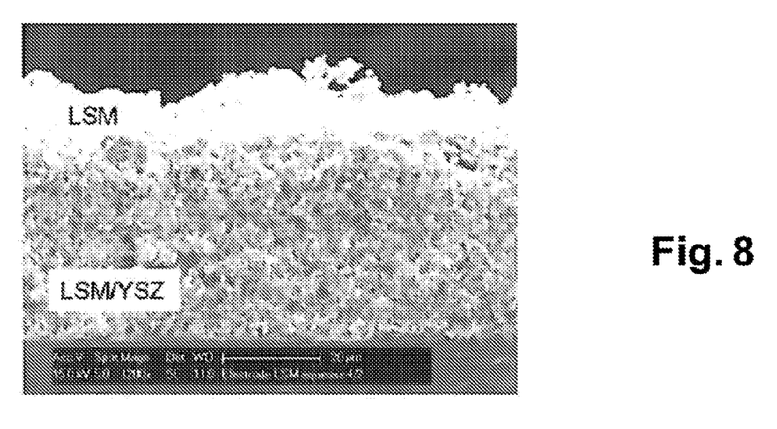
FIG. 8 illustrates the microstructure of an air electrode containing LSM formed from aqueous inks and calcined at 1,050° C. for 3 hours under air.

This so-called "symmetrical" cell is calcined at 1.050° C. for 3 hours under air and characterized by complex impedance spectroscopy at different temperatures. The typical electrode microstructure is shown in FIG. 8.

c) Electrochemical Electrode Characteristics.

Figure 9:
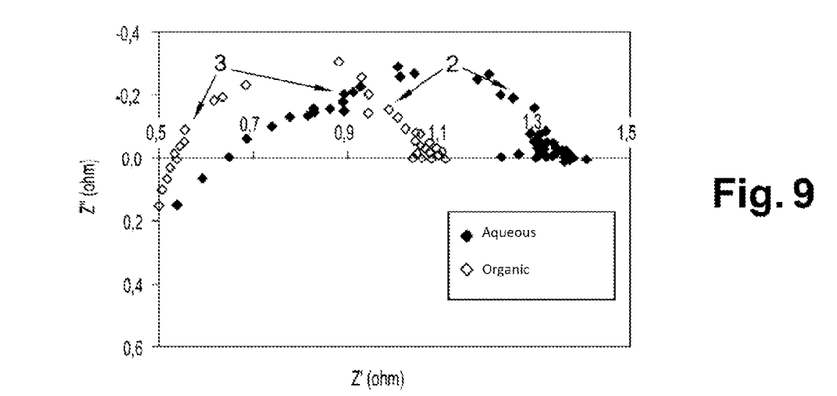
FIG. 9 shows the comparison of the impedance spectrums obtained from electrodes containing LSM respectively formed by means of organic and aqueous inks.
Figure 10:
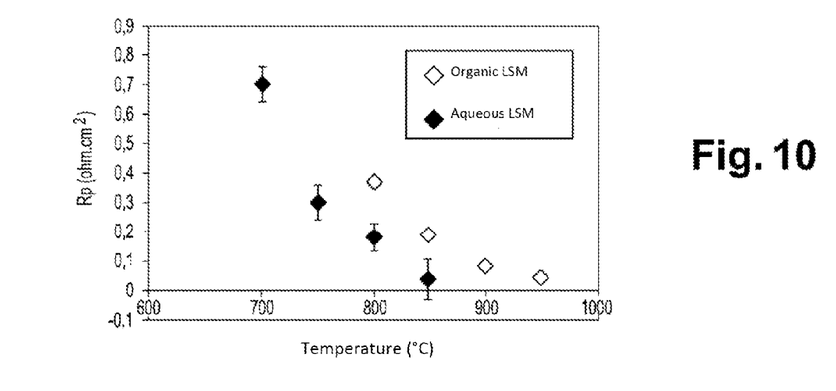
FIG. 10 shows the comparison of the polarization resistances according to temperature of electrodes containing LSM respectively formed by means of organic and aqueous inks.

The impedance spectrums obtained from the electrodes containing LSM respectively obtained by means of organic and aqueous inks are compared in FIG. 9 while the values of the polarization resistances obtained according to temperature on these two types of electrodes are illustrated in FIG. 10.

These results show that it is possible, with aqueous inks, to reproduce the architecture of electrodes obtained from organic inks with a better particle dispersion, which translates as improved electrochemical performances (polarization resistance).

Example 2

Composite Hydrogen Electrode Containing NiO/YSZ a) Organic Inks (Prior Art):

A so-called symmetrical cell is prepared by means of three organic inks having a composition according to table 5.

TABLE 5

Composition of organic inks containing YSZ and NiO (prior art)

| Ink reference | % vol. mineral filler | % vol. terpineol | % vol. ethyl cellulose | Viscosity$^{(i)}$ (Pa · s) |
|---|---|---|---|---|
| YSZ | 20% | 76.7% | 3.3% | 12.5 |
| YSZ/NiO 50/50% weight | 19.0% | 77.7% | 3.3% | 8.5 |
| NiO | 19.3% | 77.4% | 3.3% | 7 |

Figure 11:
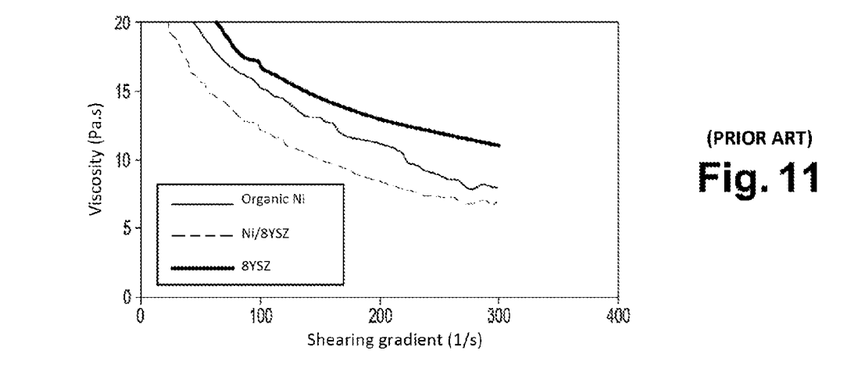
FIG. 11 shows the typical rheological behavior of organic YSZ, LSM/NiO, and NiO inks.

$^{(i)}$ Viscosity measured at the printing shearing (250 s$^{-1}$) (FIG. 11)

The ink containing YSZ is deposited symmetrically (2 faces) on a dense YSZ electrolyte with a 5-micrometer thickness by screen printing to obtain the electrode bonding layer necessary to have a fine bonding between the functional layer and the electrolyte.

The functional layer based on a YSZ/NiO mixture (50/50% by weight) is deposited in the same way on the bonding layers with a 20-micrometer thickness, after which the 10-micrometer collector layer containing NiO is added.

Figure 12:
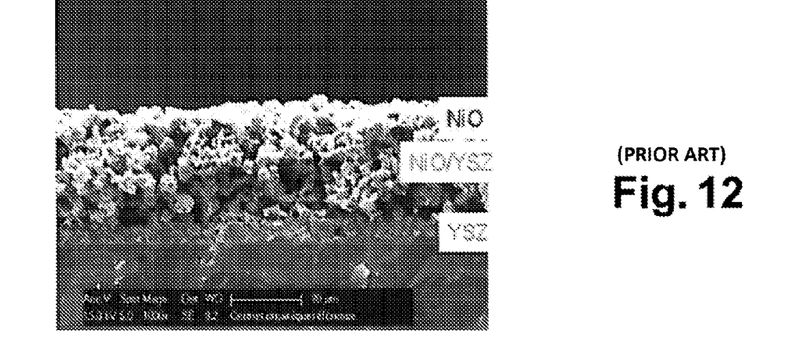
FIG. 12 illustrates the typical microstructure of a hydrogen electrode containing YSZ and NiO formed from organic inks and calcined at 1,200° C. for 3 hours under air.

This so-called "symmetrical" cell is calcined at 1.200° C. for 3 hours under air and characterized by complex impedance spectroscopy at different temperatures. The typical electrode microstructure is shown in FIG. 12.

b) Aqueous Inks (Invention):

Similarly to the symmetrical cell obtained by means of organic inks, a cell having approximately 5 micrometers of bonding layer (YSZ), 25 micrometers of functional layer (NiO/YSZ), and 25 micrometers of collector layer (NiO) is obtained by means of aqueous inks having a composition according to table 6.

TABLE 6

Composition of aqueous inks containing YSZ and NiO (invention)

| Ink reference | % vol. mineral filler | % vol. water | % vol. PVA | % vol. PEG | % weight ammonium citrate/ mineral filler | Viscosity[i] (Pa·s) |
|---|---|---|---|---|---|---|
| YSZ | 20.5% | 45.5% | 31.7% | 2% | 0.3% | 4 |
| YSZ/NiO 50/50% weight | 19.5% | 45.0% | 33.2% | 2% | 0.3% | 3.7 |
| NiO | 22% | 44% | 30.7% | 3% | 0.3% | 5.9 |

Figure 13:
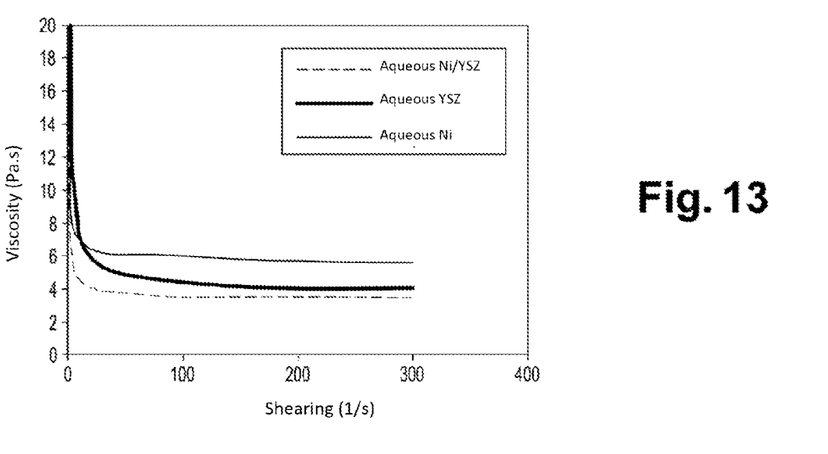
FIG. 13 shows the rheological behavior of aqueous YSZ, LSM/NiO, and NiO inks.

[i]Viscosity measured at the printing shearing (250 s$^{-1}$) (FIG. 13)

Figure 14:
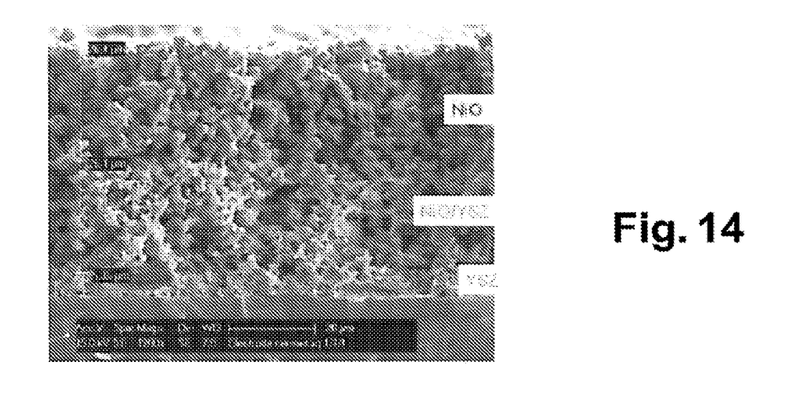
FIG. 14 illustrates the microstructure of a hydrogen electrode containing YSZ and NiO foamed from aqueous inks and calcined at 1,200° C. for 3 hours under air.

This so-called "symmetrical" cell is calcined at 1.200° C. for 3 hours under air and characterized by complex impedance spectroscopy at different temperatures. The typical electrode microstructure is shown in FIG. 14.

c) Electrochemical Electrode Characteristics.

Figure 15:
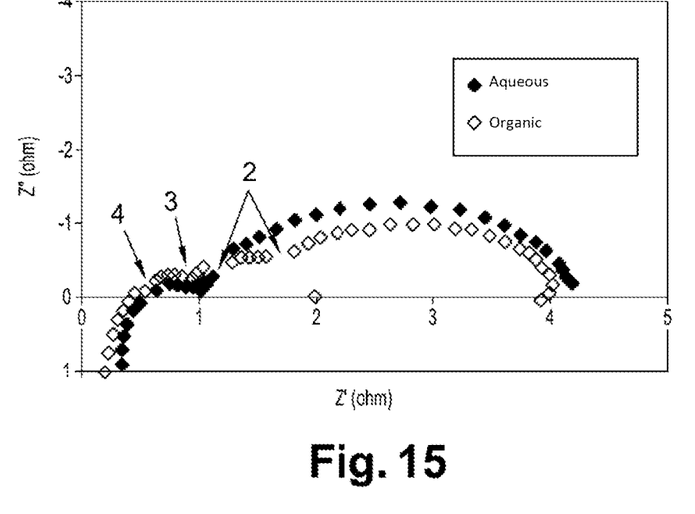
FIG. 15 shows the comparison of the impedance spectrums obtained from electrodes containing YSZ and NiO respectively formed by means of organic and aqueous inks.
Figure 16:
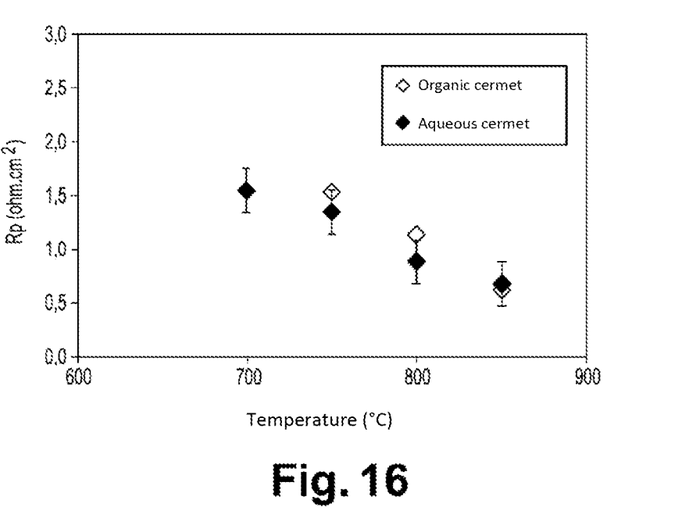
FIG. 16 shows the comparison of the polarization resistances according to temperature of electrodes containing YSZ and NiO respectively formed by means of organic and aqueous inks.

FIG. 15 shows the comparison of the impedance spectrums obtained from hydrogen electrodes containing YSZ and NiO respectively formed by means of organic and aqueous inks. FIG. 16 shows the polarization resistance values obtained according to temperature in these two types of electrodes.

These results show that it is possible, with aqueous inks, to reproduce the architecture of electrodes obtained for organic inks with a better particle dispersion, which translates as improved electrochemical performances (polarization resistance).

The invention claimed is:

1. An aqueous ink for high-temperature electrochemical cell electrodes and/or electrolyte, said ink comprising:
    particles of at least one mineral filler,
    at least one binder, and
    at least one dispersant selected from the group comprising hydrochloric acid, sulfuric acid, and polyelectrolytes,
    wherein 50% of the mineral filler particles have a diameter smaller than 10 μm and 90% of the mineral filler particles have a diameter smaller than 50 μm.

2. The aqueous ink of claim 1, wherein the mineral filler is selected from the group consisting of oxides of transition metals and rare earths, and mixtures thereof.

3. The aqueous ink of claim 1, wherein the binder is selected from the group consisting of PVA (polyvinyl alcohol), PEG (polyethylene glycol), polyacrylates, celluloses and the mixtures thereof.

4. The aqueous ink of claim 1, wherein 50% of the mineral filler particles have a diameter smaller than 1 μm and 90% of the mineral filler particles have a diameter smaller than 2 μm.

5. The aqueous ink of claim 1, wherein a viscosity of the ink ranges between 1 and 60 Pa·s at the printing shearing.

6. The aqueous ink of claim 1, wherein an amount of the mineral filler is in a range of 10 to 30% by volume with respect to a total volume of the aqueous ink.

7. The aqueous ink of claim 1, wherein an amount of the binder is in a range of 20 to 50% by volume with respect to a total volume of the aqueous ink.

8. The aqueous ink of claim 1, wherein the binder is a PVA/PEG mixture, and wherein an amount of the PVA is 80 to 100% by weight of the weight of the PVA/PEG mixture.

9. The aqueous ink of claim 1, wherein the mineral filler is selected from the group consisting of LSM (lanthanum strontium manganite), YSZ (yttria-stabilized zirconia), NiO (nickel oxide), CYO (yttrium-substituted cerium oxide), CGO (gadolinium-substituted cerium oxide), a LSM/YSM mixture, a YSZ/NiO mixture, and mixtures thereof.

10. The aqueous ink of claim 1, wherein an amount of the mineral filler is in a range of 15 to 25% by volume with respect to a total volume of the aqueous ink.

11. The aqueous ink of claim 1, wherein an amount of the binder is in a range of 25 to 35% by volume with respect to a total volume of the aqueous ink.

12. The aqueous ink of claim 1, wherein the binder is a PVA/PEG mixture, and wherein an amount of the PVA is 95 to 99% by weight of the weight of the PVA/PEG mixture.

13. The aqueous ink of claim 1, wherein the binder is a PVA/PEG mixture.

14. The aqueous ink of claim 1, wherein the polyelectrolytes are ammonium citrate.

15. The aqueous ink of claim 1, wherein the polyelectrolytes are ammonium carboxylates.

* * * * *